US012181568B2

(12) United States Patent
Trummer

(10) Patent No.: US 12,181,568 B2
(45) Date of Patent: Dec. 31, 2024

(54) 360° MIMO RADAR SYSTEM HAVING MULTIPLE RADAR SENSORS AND PHASE CALIBRATION VIA OVER-LAPPING VIRTUAL TX AND RX ANTENNAS OF ADJACENT RADAR SENSORS

(71) Applicant: Astyx GmbH, Ottobrunn (DE)

(72) Inventor: Stefan Trummer, Taufkirchen (DE)

(73) Assignee: GM Cruise Holdings LLC, San Francisco, CA (US)

( * ) Notice: Subject to any disclaimer, the term of this patent is extended or adjusted under 35 U.S.C. 154(b) by 658 days.

(21) Appl. No.: 17/282,980

(22) PCT Filed: Sep. 11, 2019

(86) PCT No.: PCT/EP2019/074263
§ 371 (c)(1),
(2) Date: Apr. 5, 2021

(87) PCT Pub. No.: WO2020/069831
PCT Pub. Date: Apr. 9, 2020

(65) Prior Publication Data
US 2021/0349201 A1  Nov. 11, 2021

(30) Foreign Application Priority Data
Oct. 5, 2018  (DE) .......................... 102018217110.6

(51) Int. Cl.
*G01S 13/87* (2006.01)
*G01S 7/02* (2006.01)
(Continued)

(52) U.S. Cl.
CPC .............. *G01S 13/87* (2013.01); *G01S 7/023* (2013.01); *G01S 7/0233* (2021.05);
(Continued)

(58) Field of Classification Search
CPC .......... G01S 7/03; G01S 7/352; G01S 7/0233; G01S 7/0234; G01S 13/36; G01S 13/87;
(Continued)

(56) References Cited

U.S. PATENT DOCUMENTS 10,088,564 B2 * 10/2018 Longstaff ................ G01S 13/89
11,609,303 B2 * 3/2023 Stettiner ............... G01S 7/0235
(Continued)

FOREIGN PATENT DOCUMENTS

CN        106461770 A  *  2/2017  .......... G01S 13/003
DE    102013102424 A1      9/2014
(Continued)

OTHER PUBLICATIONS

"International Search Report for PCT Patent Application No. PCT/EP2019/074263", Mailed Date: Feb. 2, 2020, 6 Pages.
"Written Opinion of the International Searching Authority for PCT Patent Application No. PCT/EP2019/074263", Mailed Date: Feb. 2, 2020, 11 Pages.
(Continued)

*Primary Examiner* — Vladimir Magloire
*Assistant Examiner* — Maxine McKenzie Phillips
(74) *Attorney, Agent, or Firm* — Michael DiCato

(57) ABSTRACT

The invention describes a radar system consisting of a plurality of subcomponents each individually having all components of a radar device which comprise at least transmitters, receivers, a mixer and a phase locked loop, wherein an individual phase code is generated for each transmitter; and transmitters and receivers of all subcomponents of the radar system together provide a virtual overall arrangement according to the Multiple Input Multiple Output method, wherein at least one virtual sub-arrangement of the overall arrangement, provided by a combination of transmitters of a subcomponent and receivers of a subcomponent, has at least one overlapping column or one over-
(Continued)

PMCW MIMO radar system consisting, for example, of two subcomponents lapping row with another virtual sub-arrangement of the overall arrangement, wherein the at least other virtual sub-arrangement is provided by another combination of transmitters of a subcomponent and receivers of a subcomponent.

14 Claims, 7 Drawing Sheets

(51) Int. Cl.
| | |
|---|---|
| *G01S 7/03* | (2006.01) |
| *G01S 7/35* | (2006.01) |
| *G01S 13/32* | (2006.01) |
| *G01S 13/36* | (2006.01) |
| *G01S 13/931* | (2020.01) |
| *H03L 7/099* | (2006.01) |

(52) U.S. Cl.
CPC .............. *G01S 7/0234* (2021.05); *G01S 7/03* (2013.01); *G01S 7/352* (2013.01); *G01S 13/325* (2013.01); *G01S 13/36* (2013.01); *G01S 13/931* (2013.01); *G01S 2013/93271* (2020.01); *G01S 2013/93272* (2020.01); *G01S 2013/93274* (2020.01); *H03L 7/099* (2013.01)

(58) Field of Classification Search
CPC ................. G01S 13/325; G01S 13/931; G01S 2013/93271; G01S 2013/93272; G01S 2013/93274; H03L 7/099
See application file for complete search history.

(56) References Cited

U.S. PATENT DOCUMENTS

| | | |
|---|---|---|
| 2016/0146931 A1 | 5/2016 | Rao et al. |
| 2017/0090015 A1 | 3/2017 | Breen et al. |
| 2018/0166794 A1* | 6/2018 | Raphaeli ................. G01S 13/42 |

FOREIGN PATENT DOCUMENTS

| | | | | |
|---|---|---|---|---|
| DE | 102017129503 A1 | | 6/2018 | |
| DE | 102018200751 A1 | * | 7/2019 | .......... G01S 13/003 |
| DE | 102018217110 A1 | | 4/2020 | |
| EP | 3021132 A1 | | 5/2016 | |
| JP | 2012198070 A | * | 10/2012 | |
| JP | 2015190944 A | | 11/2015 | |
| KR | 20060098505 A | * | 9/2006 | |
| WO | WO-2018115370 A1 | * | 6/2018 | .......... G01S 13/003 |
| WO | 2020069831 A1 | | 4/2020 | |

OTHER PUBLICATIONS

Bourdoux, et al., "PMCW Waveform and MIMO Technique for a 79 Ghz CMOS Automotive Radar", In 2016 IEEE Radar Conference, May 2016, 5 pages.
"International Preliminary Report on Patentability for PCT Patent Application No. PCT/EP2019/074263", Mailed Date: Apr. 6, 2021, 12 pages.
"Search Report for German Patent Application No. 102018217110. 6", Mailed Date: Aug. 21, 2019, 11 pages.
Texas Instruments, "AWR1642 Single-Chip 77- and 79-GHz FMCW Radar Sensor", SWRS203A, May 2017, 88 pages.

* cited by examiner

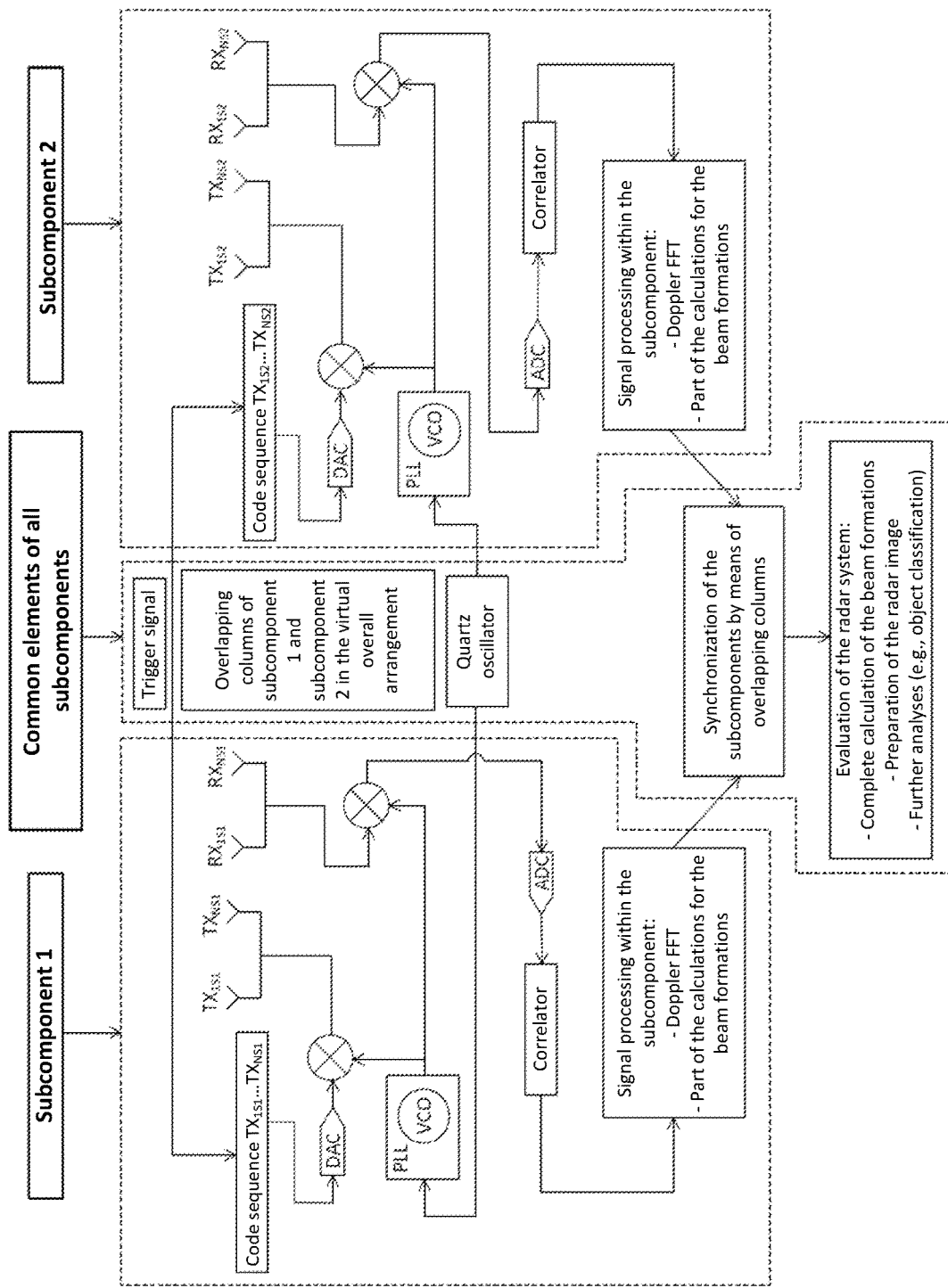
Fig. 1: PMCW MIMO radar system consisting, for example, of two subcomponents

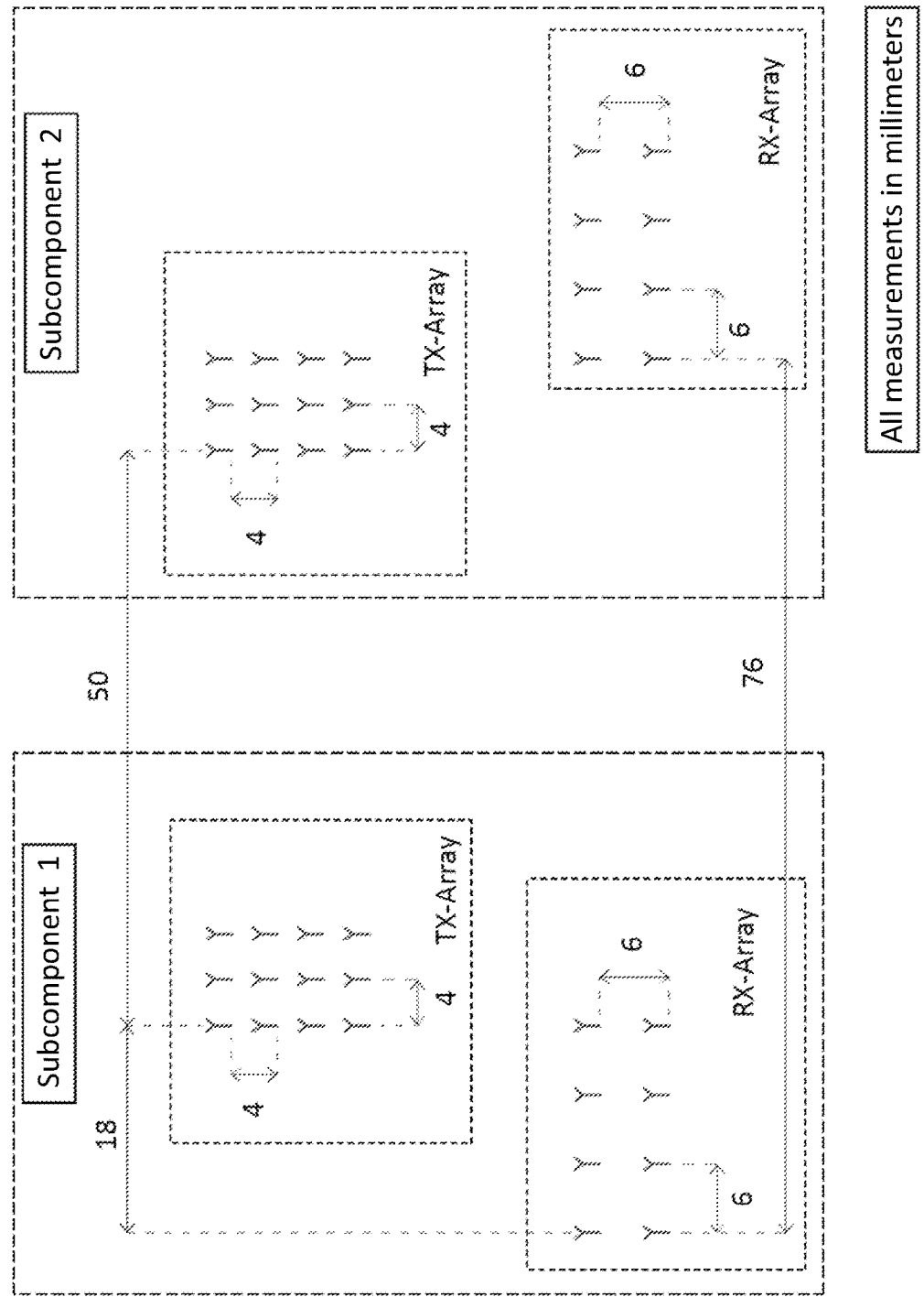
Fig. 2: Exemplary transmitter and receiver arrangement of the radar system consisting of two subcomponents

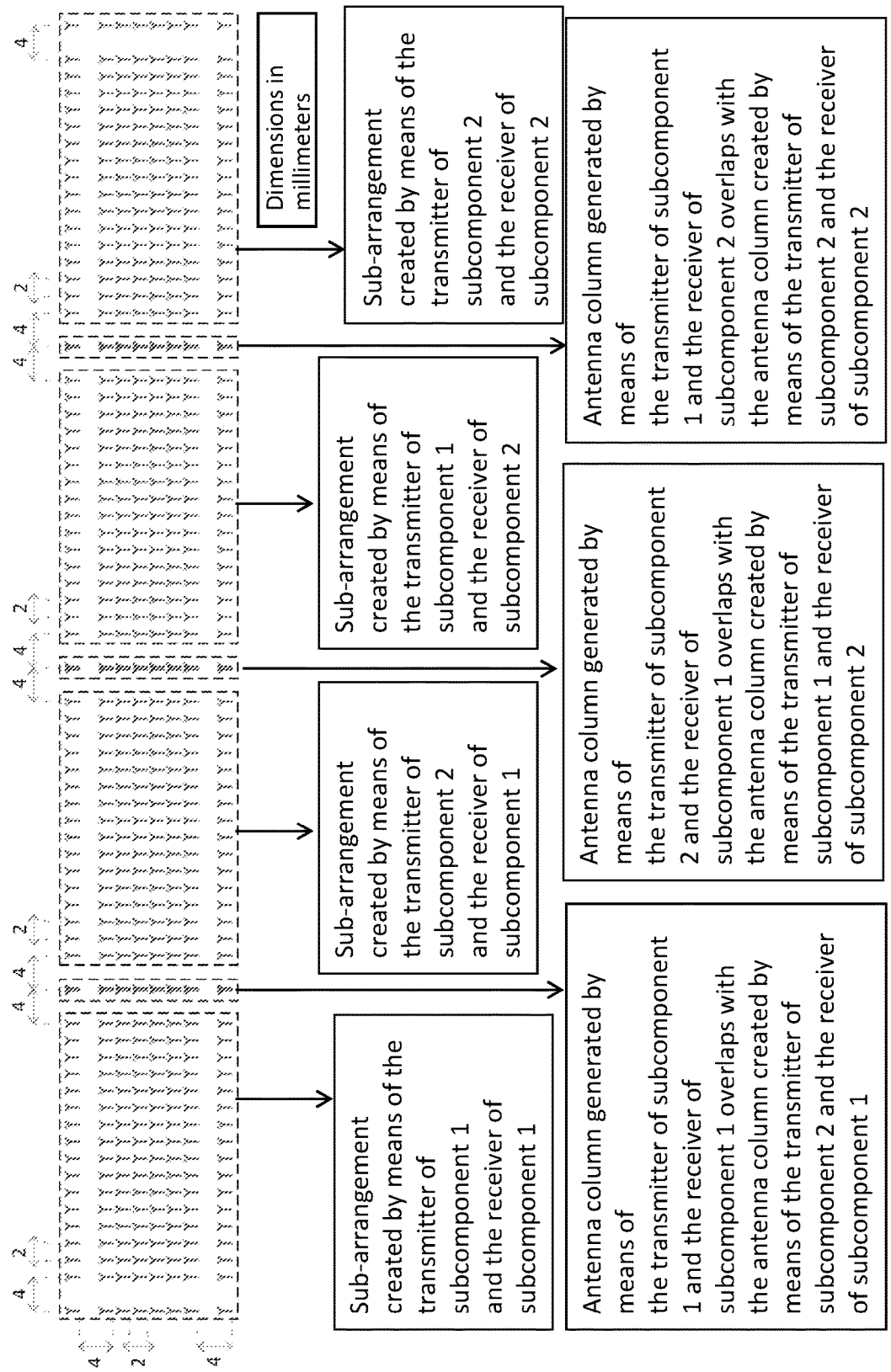
Fig. 3: Virtual overall arrangement for the transmitter and receiver arrangement according to Fig. 2

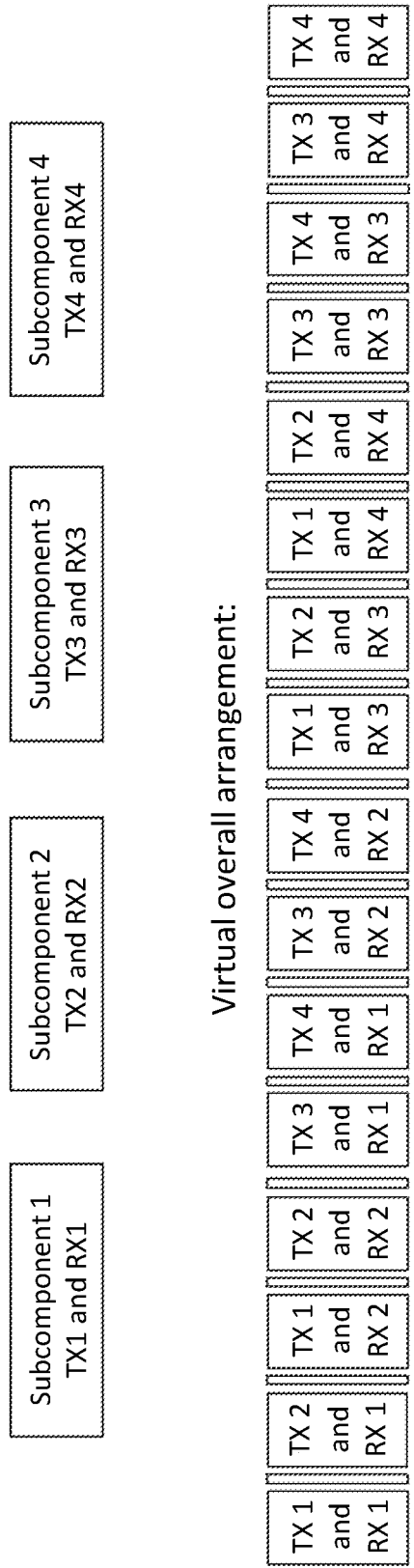
Fig. 4: Radar system consisting of 4 subcomponents

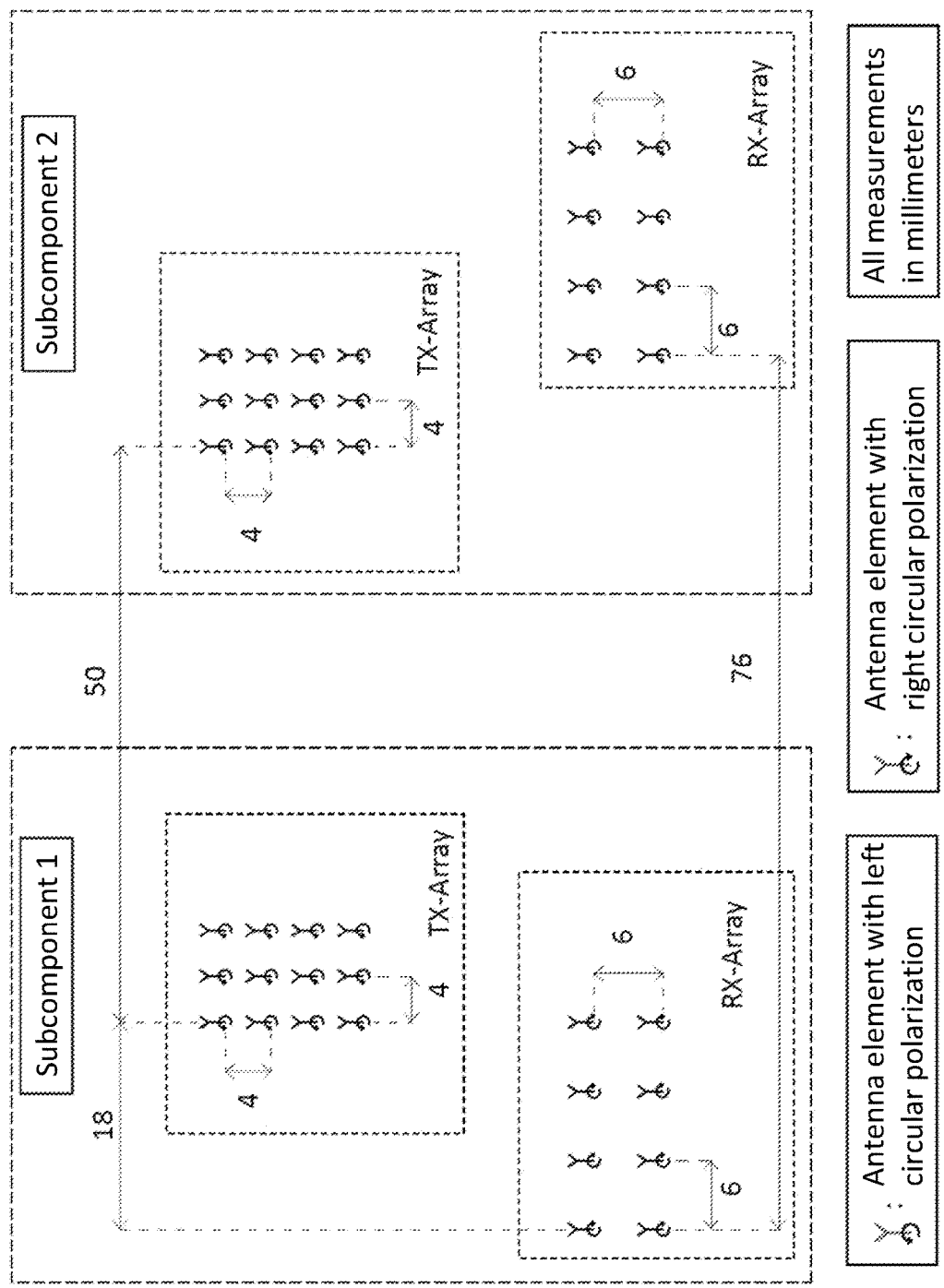
Fig. 5: Exemplary transmitter and receiver arrangement of the radar system when using circular polarimetry

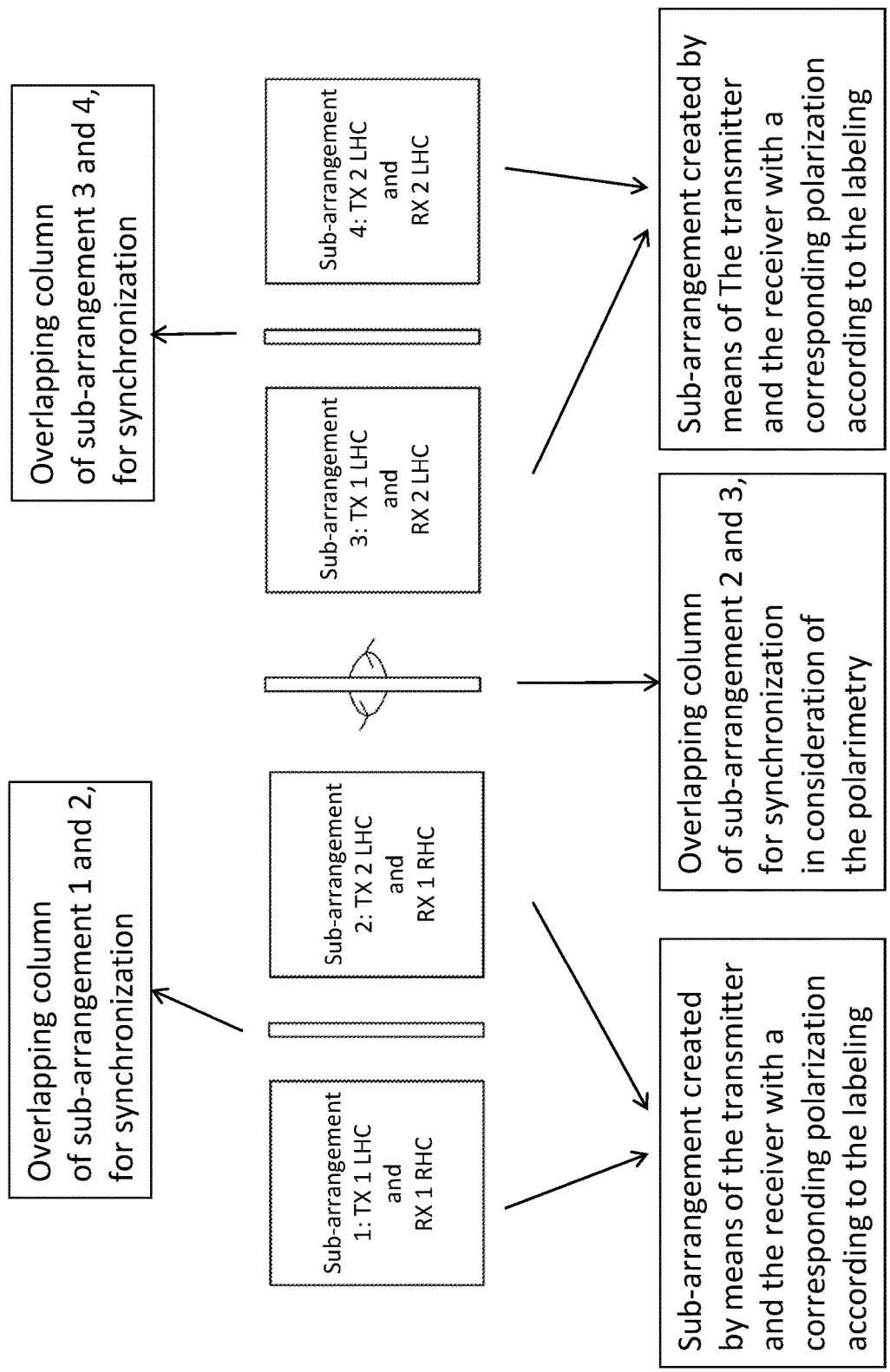
Fig. 6: Virtual overall arrangement for the transmitter and receiver arrangement according to Fig. 5

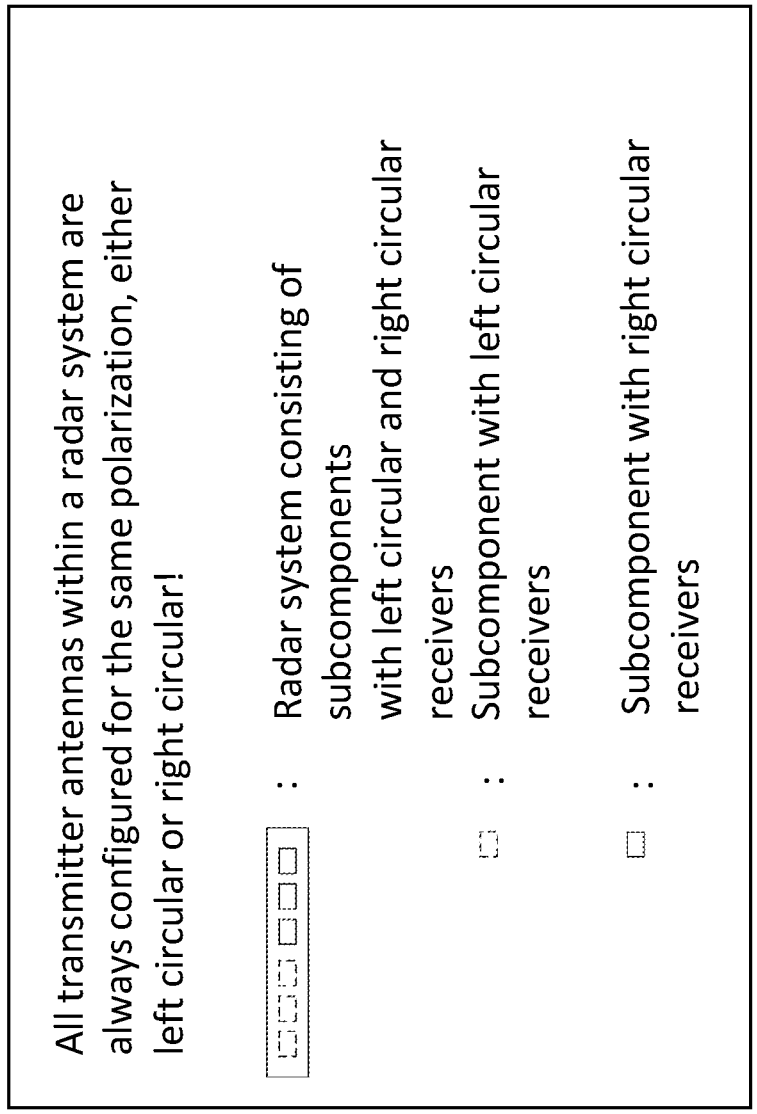
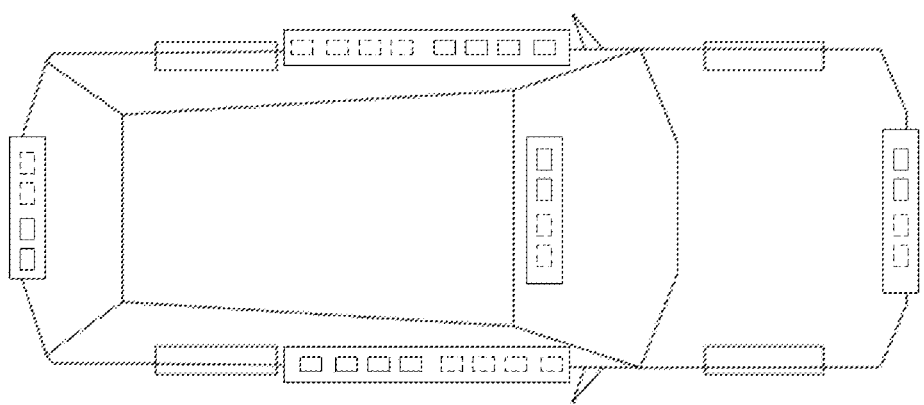
Fig. 7: Exemplary arrangement of a radar system with a different Number of subcomponents in a vehicle for a 360° environment detection

360° MIMO RADAR SYSTEM HAVING MULTIPLE RADAR SENSORS AND PHASE CALIBRATION VIA OVER-LAPPING VIRTUAL TX AND RX ANTENNAS OF ADJACENT RADAR SENSORS

The present invention relates to a radar system consisting of a plurality of subcomponents for synchronizing sensors by means of overlapping columns.

In the future, the desired autonomous driving will require a 360° monitoring of the surroundings of a vehicle. Radar sensors play a decisive role here due to their inexpensive production, their usability during the day and at night and their weather resistance. The aim is to achieve a beam bundling with a radar system that is comparable to a LiDAR sensor that emits laser beams. For this purpose, it is necessary to interconnect a plurality of radar devices in a so-called "distributed radar system." A simultaneous use of a plurality of sensors allows for a modulation method with coded modulation. Due to the usability of longer codes with a corresponding separability, it is advantageous to use the PMCW as the modulation method. To ensure that the desired beam can be formed in a narrow fashion and that the beam can scan as desired, it is necessary that the individual sensors of the distributed radar system are synchronized with one another. An obvious approach would be to control individual antenna elements with a central sensor. To this purpose, however, high-frequency signals would have to be transmitted over long distances. This has considerable disadvantages due to tolerances and line losses and is therefore particularly unsuitable for the high synchronization requirements of devices with PMCW modulation. Below, the individual sensors of the distributed radar system are referred to as subcomponents of the radar system.

The object of the present invention is to avoid the disadvantages noted above. It is also an object of the present invention to achieve a sufficiently precise synchronization of the individual subcomponents of a radar system and thus provide an overall system with a smaller size and at a lower cost that does not result in errors and losses with regard to the evaluation of the radar system.

The invention relates to a radar system consisting of a plurality of subcomponents each individually having all components of a radar device which comprise at least transmitters, receivers, a mixer and a phase locked loop, wherein an individual phase code is generated for each transmitter and transmitters and receivers of all subcomponents of the radar system together provide a virtual overall arrangement according to the Multiple Input Multiple Output method, wherein at least one virtual sub-arrangement of the overall arrangement, provided by a combination of transmitters of a subcomponent and receivers of a subcomponent, has at least one overlapping column or one overlapping row with another virtual sub-arrangement of the overall arrangement, wherein the other virtual sub-arrangement is provided by another combination of transmitters of a subcomponent and receivers of a subcomponent.

A virtual overall arrangement according to the MIMO principle can be generated from the positions of the transmitters and receivers. A signal processing, which includes a Doppler FFT for a target velocity analysis and some of the calculations for the beam formations, is carried out for each subcomponent. In order for the subcomponents to be used jointly as an overall radar system, however, all subcomponents must be precisely synchronized. According to the invention, this is done by means of overlapping columns or rows. In this regard, the respective columns or rows of different transmitter-receiver combinations of different subcomponents are found in the same positions in the virtual overall arrangement.

By means of the overlapping columns or rows, the phases and amplitudes are preferably calibrated with respect to one another in accordance with the Doppler FFT so that an overall system is created that has properties that are comparable to a coherent radar system. The data from the individual partial calculations of the beam formations as well as the phase and amplitude calibration data is then transferred to a common evaluation unit. In accordance with the virtual overall arrangement, an overall system that is synchronized in terms of time, phase and amplitude can now be generated, which allows for a very high beam bundling and high angular resolution. This allows for a precise 360° monitoring of the area around a vehicle. What is innovative is that the overlapping columns or rows are connecting elements of a virtual overall arrangement that can be as continuous as desired and allows for space savings due to the lower requirements with regard to the hardware-required transmitters and receivers. Furthermore, the cost of the radar system is decreased considerably by reducing the system and by the more compact design.

The radar system according to the invention includes the use according to the invention and the method according to the invention. According to the invention, the radar system is used in a moving base, which is preferably an automobile, and preferably operates in a frequency range between 76 GHz and 81 GHz.

The method according to the invention comprises a 360° vehicle environment detection, wherein the vehicle comprises a plurality of radar systems, and their post-processed received data is transmitted to a central unit on the vehicle, with this receiving data preferably containing the following object information: Distance, azimuth and elevation angles, speeds, micro-Doppler, polarimetric properties, object classes.

Further advantageous embodiments of the invention are the subject matter of the subclaims.

For the radar system described herein, it is advantageous to use a quartz oscillator that is used as a common reference phase for the phase locked loops of all subcomponents. The crystal frequency is a frequency that is many times smaller than the high-frequency carrier signal that is emitted. A low-loss and insensitive signal distribution to the subcomponents is thus possible and a pseudo-coherence between the subcomponents can be established. All transmitters of the radar system according to the invention are operated with a phase code according to the phase modulated, continuous wave modulation method.

The overlapping columns or overlapping rows are used at least for a phase calibration of the received signals so that the sub-arrangements of the virtual overall system can be calibrated with respect to one another.

Preferably, part of the post-processing of the received signals, which includes at least a correlation and a Fourier transformation for a speed analysis, can take place within the subcomponents of the radar system of the invention so that an improved signal processing can be achieved in the subcomponent prior to synchronization by means of the overlapping columns or rows. This minimizes the data to be transmitted to the central evaluation unit and thus allows for a high update rate.

It is necessary to synchronize the individual subcomponents so that the method according to the invention can be used. In principle, the synchronization can take place via a trigger signal or via transmitted coded signals in order to obtain the most precise possible synchronization of the overlapping columns or rows. The trigger signal connects all the subcomponents so that, from the starting time of the overall system, a rough temporal synchronization of the subcomponents, which are encumbered with the tolerances of the transmission of the trigger signal, can take place. Alternatively, the synchronization can also take place via transmitted, preferably coded, signals.

It is advantageous that the overlapping columns or rows are used for a phase and amplitude calibration of the received signals so that the sub-arrangements of the virtual overall arrangement can be calibrated as exactly as possible to one another.

In principle, the carrier signals of all transmitted waves can have a right circular polarization or the carrier signals of all transmitted waves can have a left circular polarization in order to increase the probability of detection of objects due to the circular wave. Consequently, it is advantageous that half of all the subcomponents have receivers that are designed for a left circular polarization, and the other half of the subcomponents have receivers that are designed for a right circular polarization so that the polarimetric information of objects can be analyzed.

A comparison of separate signal processings of the sub-components that have receivers configured for a left circular polarization and the subcomponents that have receivers configured for a right circular polarization can be used for the analysis of polarimetric properties of detected objects, preferably for an object classification and road condition detection. Furthermore, a common signal processing of the subcomponents that have receivers configured for a left circular polarization and the subcomponents that have receivers configured for a right circular polarization can be used for the analysis of precise angular positions of detected objects by calibrating the received signals in terms of phase and amplitude by means of overlapping columns or rows, taking polarimetric properties into account.

In addition, it is advantageous that all transmitters and all receivers of all subcomponents of the radar system jointly provide a virtual overall arrangement according to the multiple input multiple output method. Furthermore, an individual phase code consisting of a plurality of transmitters can be generated for each group.

Further advantages, features and possible applications of the present invention are addressed in the following description of the preferred exemplary embodiments in conjunction with the drawing, in which:

FIG. 1 is a schematic depiction of the PMCW-MIMO radar system according to the application consisting, for example, of two subcomponents.

FIG. 2 is a schematic depiction of an exemplary embodiment of the transmitter and receiver arrangement of the radar system according to the application consisting of two subcomponents.

FIG. 3 is a schematic depiction of the virtual overall arrangement for the transmitter and receiver arrangement according to FIG. 2.

FIG. 4 is a schematic depiction of an embodiment of the radar system according to the application consisting of 4 subcomponents.

FIG. 5 is a schematic depiction of an exemplary embodiment of the transmitter and receiver arrangement of the radar system according to the application when using circular polarimetry.

FIG. 6 is a schematic depiction of the virtual overall arrangement for the transmitter and receiver arrangement according to FIG. 5.

FIG. 7 is a schematic depiction of an exemplary arrangement of the radar system according to the application with a varying number of subcomponents in a vehicle for an 360° environment detection.

FIG. 1 is a schematic depiction of the PMCW MIMO radar system according to the application, for example, for a radar system consisting of two subcomponents. The subcomponents of the radar system comprise a plurality of transmitters (subcomponent 1: $TX_{IS1}$ to $TX_{NS1}$, subcomponent 2: $TX_{IS2}$ to $TX_{NS2}$), which are operated as much at the same time as possible. An individual phase code is generated for each transmitter and the digital signals are converted to analog using a DAC. An up-conversion to the frequency range between approx. 76 and 81 GHz follows. Each transmitter transmits its individual code, and the returning signals are sent to all receivers (subcomponent 1: $RX_{IS1}$ to $RX_{NS1}$, subcomponent 2: $RX_{IS2}$ to $RX_{NS2}$) of the radar system. The received signals are down-converted to the baseband. The same VCO is used for the up- and down-conversion within a subcomponent. The analog received signals in the baseband are converted to digital signals by means of an ADC. Then, the correlation takes place. The transmission signals from each transmitter in the overall system can now be extracted for each receiver. A virtual overall arrangement according to the MIMO principle can be generated from the positions of the transmitters and receivers. A signal processing, which includes a Doppler FFT for a target velocity analysis and some of the calculations for the beam formations, is carried out for each subcomponent. Furthermore, the radar system according to the application comprises elements that either connect the subcomponents or are used jointly by all subcomponents. Each subcomponent comprises a VCO that is located within a PLL. A common crystal is used as the reference phase for all PLLs of the subcomponents. This creates a kind of pseudo-coherence between the subcomponents. To ensure that the subcomponents can jointly be used as an overall radar system, a precise synchronization of all subcomponents is required. According to the invention, this is done by means of overlapping columns or rows. In this regard, the respective columns or rows of different transmitter-receiver combinations of different subcomponents are found in the same positions in the virtual overall arrangement.

FIG. 2. shows an exemplary embodiment of the transmitter and receiver arrangement of the overall radar system according to the application which consists of two subcomponents with each having 12 transmitting antennas and 8 receiving antennas.

FIG. 3 is a schematic depiction of the virtual overall arrangement, the antenna element positions of which result from the transmitter and receiver arrangement according to FIG. 2. When using two subcomponents, four antenna sub-arrangements that have to be synchronized with one another result. The sub-arrangements are created by all existing transmitter-receiver combinations:

First sub-arrangement: Transmitter of subcomponent 1 and receiver of subcomponent 1

Second sub-arrangement: Transmitter of subcomponent 2 and receiver of subcomponent 1

Third sub-arrangement: Transmitter of subcomponent 1 and receiver of subcomponent 2

Fourth sub-arrangement: Transmitter of subcomponent 2 and receiver of subcomponent 2

The sub-arrangements are synchronized with the phase and amplitude calibration values from the overlapping columns. There is one overlapping column each between the sub-arrangements. In this context, there are virtual columns of two adjacent sub-arrangements in exactly the same position. The overall arrangement is then synchronized, for example, in the following manner: The second sub-arrangement is calibrated to the phase and amplitude values of the first sub-arrangement. The third sub-arrangement is then calibrated to the second sub-arrangement, and subsequently the fourth sub-arrangement is calibrated to the third sub-arrangement.

FIG. 4 shows an embodiment of the radar system according to the application consisting of four subcomponents. This results in a total of 16 antenna sub-arrangements that are created from the existing transmitter-receiver combinations. Between two sub-arrangements there is an overlapping column for calibrating the phase and amplitude values. There are a total of 15 overlapping columns.

FIG. 5 shows how circular polarimetry can be used. The same antenna element positions were used as in FIG. 2 but with the difference that the antennas were configured for the following polarizations:

The transmitters of subcomponent 1 were configured for a left circular polarization. This means that the high-frequency carrier signal has a left circular polarization.

The receivers of subcomponent 1 were configured for a right circular polarization. Right circular components of the returning signals are received.

The transmitters of subcomponent 2 were configured for a left circular polarization. This means that the high-frequency carrier signal has a left circular polarization.

The receivers of subcomponent 2 were configured for a left circular polarization. Left circular components of the returning signals are received.

In this case, the right and left circular polarization can also be interchanged when applied to all antenna elements.

FIG. 6 is a schematic depiction of the virtual overall antenna arrangement that results from the transmitter and receiver arrangement according to FIG. 5. This results in four sub-arrangements. In the case of sub-arrangements 1 and 2, the transmitters are each configured for a left circular polarization and the receivers for a right circular polarization. In sub-arrangements 3 and 4, the transmitters are each configured for a left circular polarization and the receivers for a left circular polarization. An overlapping column for synchronizing the phases and amplitude values is located between all sub-arrangements. However, since sub-arrangement 2 and sub-arrangement 3 have different polarizations in their transmitter-receiver combinations, the polarimetry must be taken into account during the synchronization. Due to the dependence of the phase and amplitude values on the polarization, the phase and amplitude values must be calibrated for each returning signal or target object so that a synchronized overall arrangement is created. This overall arrangement can be used, for example, to analyze precise angular positions in azimuth.

To evaluate the polarimetric properties in addition to evaluating the overall arrangement, sub-arrangements 1 and 2 can be processed together for cross-polar properties and, separately therefrom, sub-arrangements 3 and 4 can be processed together for copolar properties. A comparison of these two evaluations allows for the analysis of polarimetric properties which can then be used, for example, for object classifications.

FIG. 7 shows, by way of example, the arrangement of radar systems with polarimetry, according to the application, in a vehicle for a 360° environment detection. In this context, radar systems are used that have subcomponents whose receivers are configured for either a left or right circular polarization. The number of subcomponents that use a right circular polarization is equal to the number of subcomponents that use a left circular polarization. The two subcomponent types are each arranged mirror-symmetrically to one another. The radar systems are positioned around the vehicle.

The invention claimed is:

1. A radar system comprising:
   a first radar sensor, where the first radar sensor comprises:
      first transmitters that are configured to emit first signals, where the first transmitters have respective first phase codes generated therefor;
      a first phase-locked loop (PLL) that is operably coupled to the first transmitters and the first receivers; and
      a first mixer that is operably coupled to the first PLL and the first receivers, where a first virtual array is formed according to the Multiple Input Multiple Output method and based upon first positions of the first transmitters and second positions of the first receivers, and further where the first virtual array comprises a first column and a first row of virtual transceivers;
   a second radar sensor, where the second radar sensor comprises:
      second transmitters that are configured to emit second signals, where the second transmitters have second phase codes generated therefor;
      second receivers that are configured to detect the reflections;
      a second PLL that is operably coupled to the second transmitters and the second receivers; and
      a second mixer that is operably coupled to the second PLL and the second receivers, where a second virtual array is formed according to the Multiple Input Multiple Output method and based upon the first positions of the first transmitters and third positions of the second receivers, the second virtual array comprises a second column and a second row of virtual transceivers, and further where at least one of:
         the first column of the first virtual array overlaps with the second column of the second virtual array, where the first column and the second column are in a same position in a virtual overall arrangement that includes the first virtual array and the second virtual array; or
         the first row of the first virtual array overlaps with the second row of the second virtual array, where the first row and the second row are in a same position in the virtual overall arrangement,
   wherein overlapping columns or overlapping rows correspond to different transmitter-receiver combinations of the first and second radar sensors and are found in the same positions in the virtual overall arrangement.

2. The radar system according to claim 1, further comprising:
   a crystal oscillator that provides a reference phase for the first PLL and the second PLL.

3. The radar system according to claim 1, characterized in that the first transmitters and the second transmitters are operated with phase codes according to the phase modulated continuous wave modulation method.

4. The system according to claim 1, characterized in that the overlapping columns or the overlapping rows are used at least for a phase calibration of the reflections.

5. The radar system according to claim 1, characterized in that a part of the post-processing of the reflections, which includes at least a correlation and a Fourier transformation for a speed analysis, takes place within the first radar sensor and the second radar sensor, respectively.

6. The radar system according to claim 1, characterized in that the first radar sensor and the second radar sensor are synchronized.

7. The radar system according to claim 6, characterized in that the synchronization takes place via a trigger signal that connects the first radar sensor and the second radar sensor.

8. The radar system according to claim 1, characterized in that the overlapping columns or the overlapping rows are used for a phase and amplitude calibration of the reflections.

9. The radar system according to claim 1, characterized in that:
   carrier signals of the first signals and the second signals have a right circular polarization; or
   the carrier signals of the first signals and the second signals have a left circular polarization.

10. The radar system according to claim 9, characterized in that the first receivers are configured for a left circular polarization, and the second receivers are configured for a right circular polarization.

11. The radar system according to claim 10, characterized in that a comparison of separate signal processings of the first receivers and the second receivers are used for object classification and road condition detection.

12. The radar system according to claim 1, characterized in that an individual phase code is generated for each of the first transmitters and the second transmitters.

13. The radar system according to claim 1, where the radar system is installed in an automobile, and further where the radar system operates in a frequency range between 76 GHz and 81 GHz.

14. A method for providing 360° environment detection, the method comprising:
   placing a radar system onto an automobile, the radar system comprising:
      a first radar sensor, where the first radar sensor comprises:
         first transmitters that are configured to emit first signals, where the first transmitters have respective first phase codes generated therefor;
         first receivers that are configured to detect reflections;
         a first phase-locked loop (PLL) that is operably coupled to the first transmitters and the first receivers; and
         a first mixer that is operably coupled to the first PLL and the first receivers, where a first virtual array is formed according to the Multiple Input Multiple Output method and based upon first positions of the first transmitters and second positions of the first receivers, and further where the first virtual array comprises a first column and a first row of virtual transceivers;
      a second radar sensor, where the second radar sensor comprises:
         second transmitters that are configured to emit second signals, where the second transmitters have second phase codes generated therefor;
         second receivers that are configured to detect the reflections;
         a second PLL that is operably coupled to the second transmitters and the second receivers; and
         a second mixer that is operably coupled to the second PLL and the second receivers, where a second virtual array is formed according to the Multiple Input Multiple Output method and based upon third positions of the second transmitters and fourth positions of the second receivers, the second virtual array comprises a second column and a second row of virtual transceivers, and further where at least one of:
            the first column of the first virtual array overlaps with the second column of the second virtual array; or
            the first row of the first virtual array overlaps with the second row of the second virtual array;
         wherein overlapping columns or overlapping rows correspond to different transmitter-receiver combinations of the first and second radar sensors and are found in the same positions in a virtual overall arrangement; and
      a central unit that is in communication with the first radar sensor and the second radar sensor; and
   providing, from each of the first radar sensor and the second radar sensor to the central unit, distance to an object and speed of the object as computed by the first radar sensor and the second radar sensor.

* * * * *